(12) United States Patent
Miyano

(10) Patent No.: US 8,124,464 B2
(45) Date of Patent: Feb. 28, 2012

(54) SEMICONDUCTOR DEVICE AND METHOD FOR MANUFACTURING THE SAME

(75) Inventor: Kiyotaka Miyano, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 57 days.

(21) Appl. No.: 12/801,918

(22) Filed: Jul. 1, 2010

(65) Prior Publication Data

US 2010/0273300 A1      Oct. 28, 2010

Related U.S. Application Data

(62) Division of application No. 11/797,012, filed on Apr. 30, 2007, now Pat. No. 7,772,640.

(30) Foreign Application Priority Data

May 1, 2006   (JP) .................................. 2006-127745

(51) Int. Cl.
*H01L 21/00* (2006.01)
(52) U.S. Cl. ......................... 438/149; 438/150; 438/151
(58) Field of Classification Search .................. 438/149, 438/150, 151, 156, 157, 198
See application file for complete search history.

(56) References Cited

U.S. PATENT DOCUMENTS

| | | | |
|---|---|---|---|
| 6,872,647 B1 * | 3/2005 | Yu et al. ........................ | 438/585 |
| 6,891,232 B2 | 5/2005 | Miyano et al. | |
| 7,087,471 B2 | 8/2006 | Beintner | |
| 7,241,653 B2 * | 7/2007 | Hareland et al. ............... | 438/199 |
| 7,268,058 B2 * | 9/2007 | Chau et al. ..................... | 438/429 |
| 7,279,375 B2 * | 10/2007 | Radosavljevic et al. ....... | 438/197 |
| 7,456,476 B2 * | 11/2008 | Hareland et al. ............... | 438/284 |
| 2005/0035415 A1 * | 2/2005 | Yeo et al. ....................... | 438/283 |
| 2005/0186742 A1 | 8/2005 | Oh et al. | |
| 2005/0199949 A1 | 9/2005 | Chau et al. | |
| 2005/0242395 A1 | 11/2005 | Chen et al. | |

FOREIGN PATENT DOCUMENTS

JP          2001-189451          7/2001

* cited by examiner

*Primary Examiner* — Kevin M Picardat
(74) *Attorney, Agent, or Firm* — Finnegan, Henderson, Farabow, Garrett & Dunner, L.L.P.

(57) ABSTRACT

This disclosure concerns a semiconductor device comprising a convex-shaped semiconductor layer formed on a semiconductor substrate; an insulation film formed on the semiconductor substrate, the insulation film having a film thickness to the extent that a lower part of the semiconductor layer is buried; a gate electrode formed on a set of both opposed side faces via a gate insulation film; and a source region and a drain region formed on a side face side on which the gate electrode is not formed in the semiconductor layer, wherein the semiconductor layer is formed so as to dispose surfaces of a peripheral part excepting a central part on an outer side than surfaces of the central part covered by at least the gate electrode.

5 Claims, 6 Drawing Sheets

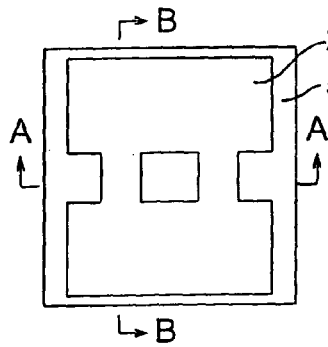 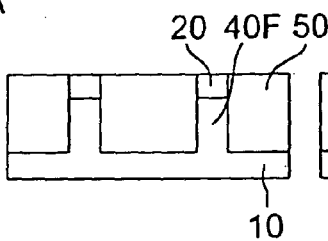 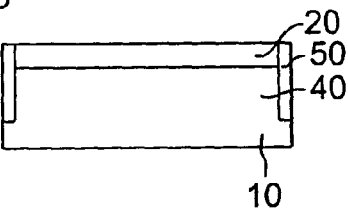
FIG. 4A   FIG. 4B   FIG. 4C
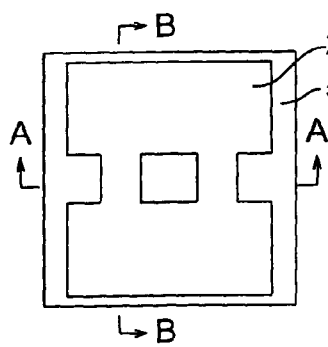 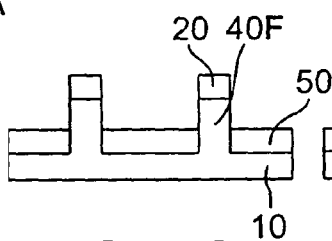 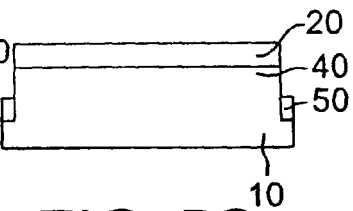
FIG. 5A   FIG. 5B   FIG. 5C
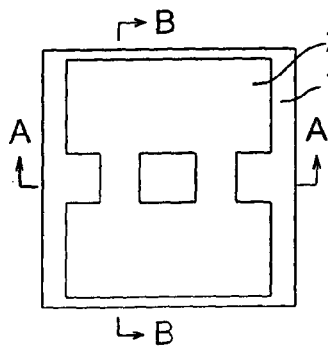 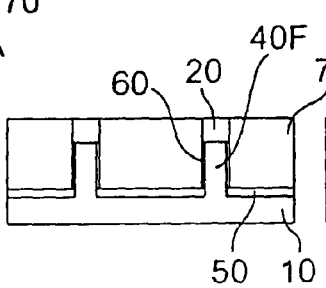 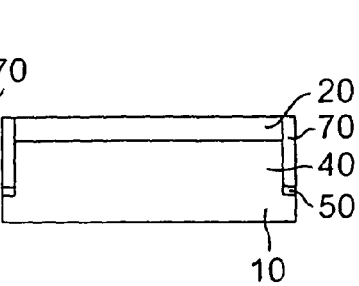
FIG. 6A   FIG. 6B   FIG. 6C

SEMICONDUCTOR DEVICE AND METHOD FOR MANUFACTURING THE SAME

This is a division of application Ser. No. 11/797,012, filed Apr. 30, 2007, now U.S. Pat. No. 7,772,640 which is incorporated herein by reference.

CROSS-REFERENCE TO RELATED APPLICATION

This application is based upon and claims the benefit of priority from the prior Japanese Patent Applications No. 2006-127745, filed on May 1, 2006, the entire contents of which are incorporated herein by reference.

BACKGROUND OF THE INVENTION

1. Field of the Invention

The present invention relates to a semiconductor device and a manufacturing method of a semiconductor device.

2. Related Art

In recent years, the MOSFETs having the so-called vertical double gate structure have been developed as MOSFETs having a three-dimensional structure. Among them, MOSFETs having a semiconductor layer formed so as to take the shape of a fin are called fin FETs.

In the case of such fin FETs, silicide for reducing parasitic resistance is formed on a surface of a source/drain region by consuming a semiconductor layer made of silicon.

In the fin FETs, therefore, it is necessary to ensure a region where silicide is to be formed while attempting to make elements finer. Therefore, a raised semiconductor layer is formed by raising wholly a surface (a top face and side faces) of a semiconductor layer which is not covered by a gate electrode and a side wall insulation film toward the outside. Thereafter, a source/drain region and silicide are formed one after another.

At that time, the raised semiconductor layer is formed by using the vapor phase epitaxy method. In the vapor phase epitaxy method, however, there is a problem that the semiconductor layer cannot be grown homogeneously. This is because a crystal plane having a desired crystal orientation cannot be formed on side faces of the raised semiconductor layer and a facet which is a specific stable crystal plane depending upon the film forming condition is formed.

For example, even if it is attempted to form a raised semiconductor layer having side faces which are <110> in crystal orientation, the use of the vapor phase epitaxy method poses a problem that a facet which is <111> in crystal orientation is formed on the side faces of the raised semiconductor layer.

SUMMARY OF THE INVENTION

A semiconductor device according to an embodiment of the present invention comprises a convex-shaped semiconductor layer formed on a semiconductor substrate; an insulation film formed on the semiconductor substrate, the insulation film having a film thickness to the extent that a lower part of the semiconductor layer is buried; a gate electrode formed on a set of both opposed side faces via a gate insulation film; and a source region and a drain region formed on a side face side on which the gate electrode is not formed in the semiconductor layer, wherein the semiconductor layer is formed so as to dispose surfaces of a peripheral part excepting a central part on an outer side than surfaces of the central part covered by at least the gate electrode.

A semiconductor device according to an embodiment of the present invention comprises a fin-type semiconductor layer formed on a semiconductor substrate to have a {110} crystal plane as a side face of the fin-type semiconductor layer; a source region formed in the fin-type semiconductor layer; a drain region formed in the fin-type semiconductor layer; a channel region provided in the fin-type semiconductor layer between the source region and the drain region; a gate insulation film provided on the side face of the fin-type semiconductor layer in the channel region; and a gate electrode provided on the side face of the fin-type semiconductor layer via the gate insulation film, wherein the side face of the fin-type semiconductor layer in the source region and the drain region is parallel to the side face of the fin-type semiconductor layer in the channel region, and the side face of the fin-type semiconductor layer in the source region and the drain region is advanced in a direction of a crystal orientation <110> as compared with the side face of the fin-type semiconductor layer in the channel region.

A semiconductor device manufacturing method according to an embodiment of the present invention comprises depositing a mask material on a semiconductor substrate, performing patterning on surface parts of the mask material and the semiconductor substrate, and thereby forming a semiconductor layer having a convex shape; forming an insulation film having a film thickness to an extent that a lower part of the semiconductor layer is buried; forming a gate insulation film on one set of both opposed side faces of the semiconductor layer; depositing a gate electrode material on the insulation film, the gate insulation film and the mask material, performing patterning on the gate electrode material and the gate insulation film, and thereby forming a gate electrode on the one set of both opposed side faces and a top face of the semiconductor layer via the gate insulation film and the mask material; forming a side wall insulation film on side faces of the gate electrode, and removing the mask material which is not covered by the gate electrode and the side wall insulation film; forming an amorphous semiconductor film on the semiconductor layer, the insulation film, the gate electrode and the side wall insulation film; selectively forming the amorphous semiconductor film formed on the top face and side faces into single crystals and thereby forming a raised semiconductor layer; selectively removing a region which is not formed into single crystals in the amorphous semiconductor film; and performing ion implantation of predetermined impurities into the picked-up semiconductor layer by using the gate electrode and the side wall insulation film as a mask, and thereby forming a source region and a drain region on a side face on which the gate electrode is not formed.

A semiconductor device manufacturing method according to an embodiment of the present invention comprises forming a fin-type semiconductor layer having a {110} crystal plane as a side face thereof on a semiconductor substrate by etching the semiconductor substrate; forming a gate insulation film on a channel forming region of the fin-type semiconductor layer; forming a gate electrode on the gate insulation film; depositing an amorphous semiconductor film on a top face and the side face in a source forming region and a drain forming region of the fin-type semiconductor layer; forming the amorphous semiconductor film into single crystals by using a solid phase epitaxy method to advance the side face of the fin-type semiconductor layer in the source forming region and the drain forming region in a direction of a crystal orientation <110> as compared with the side face of the fin-type semiconductor layer in the channel forming region; and introducing impurities into the source forming region and the drain forming region of the fin-type semiconductor layer to form a source region and a drain region.

BRIEF DESCRIPTION OF THE DRAWINGS

FIGS. 4A to 4C are a plan view and cross-sectional views showing a method for manufacturing fin FETs according to the first embodiment;

FIGS. 5A to 5C are a plan view and cross-sectional views showing a method for manufacturing fin FETs according to the first embodiment;

FIGS. 6A to 6C are a plan view and cross-sectional views showing a method for manufacturing fin FETs according to the first embodiment;

DETAILED DESCRIPTION OF THE INVENTION

Hereafter, embodiments of the present invention will be described with reference to the drawings.

(1) First Embodiment

FIGS. 1 to 13 show a method for manufacturing fin FETs according to a first embodiment of the present invention. Among FIGS. 1 to 13, FIGS. 2A to 12A show plan views obtained when viewing elements from the above in respective processes. FIGS. 2B to 12B show longitudinal section views obtained when cutting elements along a line A-A in respective processes. FIGS. 2C to 12C show longitudinal section views obtained when cutting elements along a line B-B in respective processes.

First, as shown in FIG. 1 and FIGS. 2A to 2C, a semiconductor substrate 10 made of, for example, single crystal silicon and having a surface orientation of <100> is prepared. A resist mask which is not illustrated and which has a desired pattern is formed on the semiconductor substrate 10 by using the lithography. By using the resist mask as a mask, ion implantation of boron (B), gallium (Ga), indium (In) or the like into the semiconductor substrate 10 is conducted. A P-type semiconductor region which has a depth of approximately 1 μm and which is not illustrated is formed by conducting heat treatment.

Figure 1:
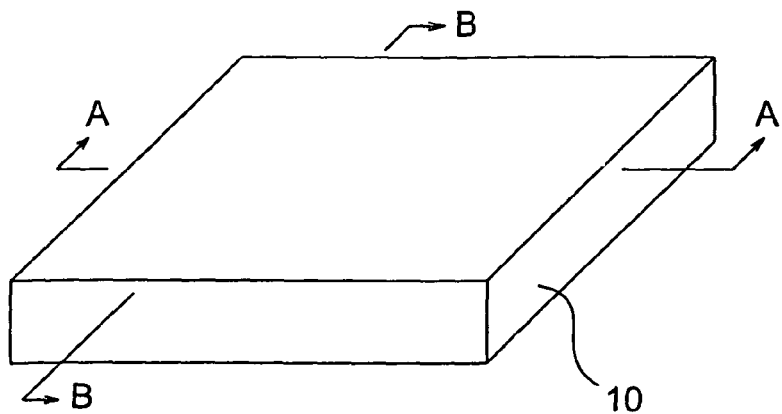
FIG. 1 is a perspective view showing a method for manufacturing fin FETs according to a first embodiment of the present invention.
Figures 2A, 2B, 2C:
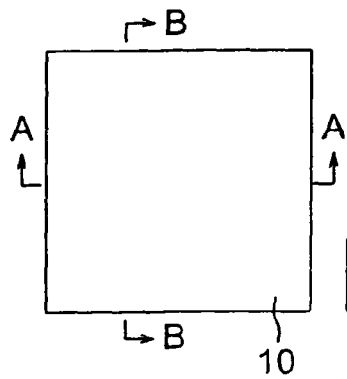
FIGS. 2A to 2C are a plan view and cross-sectional views showing a method for manufacturing fin FETs according to the first embodiment.
Figures 3A, 3B, 3C:
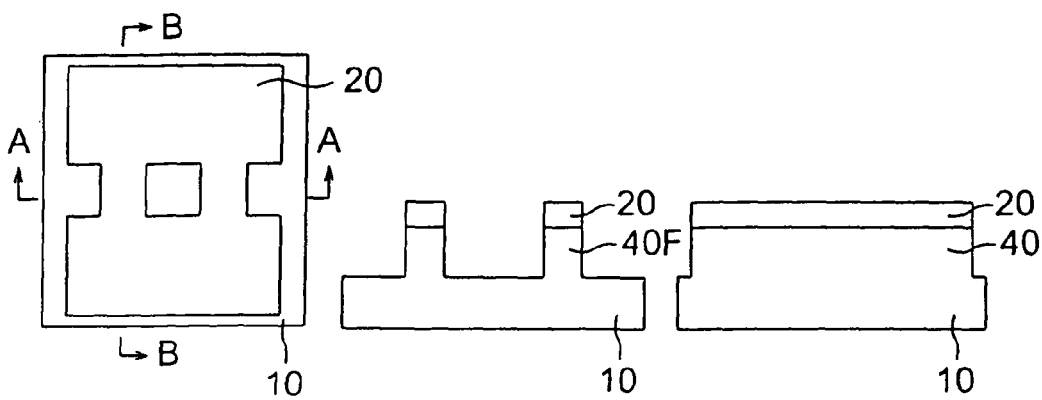
FIGS. 3A to 3C are a plan view and cross-sectional views showing a method for manufacturing fin FETs according to the first embodiment.

As shown in FIG. 3A to 3C, a mask material 20 formed of, for example, a silicon nitride (SiN) film is deposited on the semiconductor substrate 10 and then patterning is conducted on the mask material 20 by using the lithography and RIE. In addition, etching with a depth of approximately 100 nm is conducted on the semiconductor substrate 10 by using the mask material 20 as a mask. As a result, a convex shaped semiconductor layer 40 having two fins 40F which are <110> in crystal orientation of side faces is formed.

As shown in FIG. 4A to 4C, a silicon oxide (SiO$_2$) film having a thickness of approximately several nm is formed on the whole surface. Thereafter, the silicon oxide film formed on side faces of the semiconductor layer 40 inclusive of the fins 40F are removed by wet etching using dilute fluoric acid.

An insulation film formed of, for example, a silicon oxide film 50 is deposited on the whole surface by using the CVD method. Thereafter, the insulation film 50 is planarized by using the mask material 20 as a stopper and by using the CMP method. As a result, the top face of the mask material 20 is exposed.

As shown in FIG. 5A to 5C, etching is conducted on the insulation film 50 by using the mask material 20 as a mask and using the RIE. The insulation film 50 is thus provided with a predetermined film thickness to expose an upper part of the semiconductor layer 40.

As shown in FIG. 6A to 6C, a gate insulation film 60 having a thickness of approximately 1 nm formed of, for example, a silicon oxide nitride (SiON) film is formed on each of opposite side faces of each fin 40F.

Subsequently, a polysilicon film 70 serving as a gate electrode material is formed by using the CVD method. Thereafter, the polysilicon film 70 is planarized by using the mask material 20 as a stopper and using the CMP method.

Figures 7A, 7B, 7C:
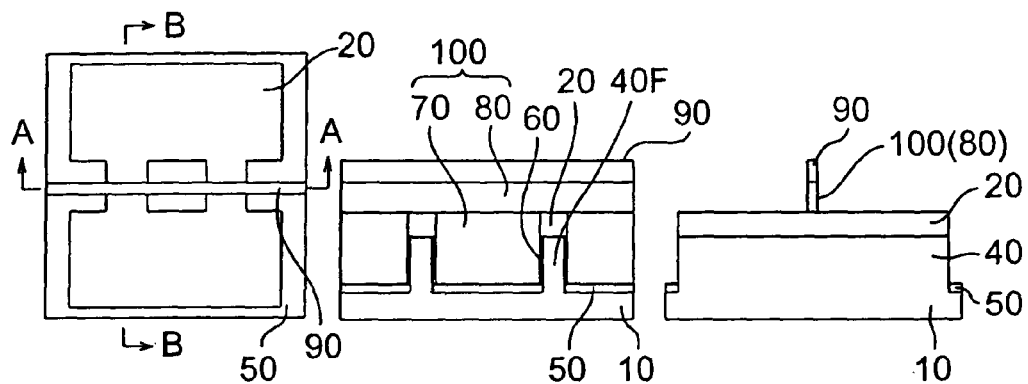
FIGS. 7A to 7C are a plan view and cross-sectional views showing a method for manufacturing fin FETs according to the first embodiment.

In addition, a polysilicon film 80 is formed as an electrode material by using the CVD method as shown in FIG. 7A to 7C. Thereafter, ion implantation of, for example, boron (B) into the polysilicon films 70 and 80 is conducted with a dose of approximately $5 \times 10^{15}$ cm$^{-2}$.

Subsequently, a mask material 90 formed of a silicon nitride (SiN) film is deposited on the polysilicon film 80. Thereafter, predetermined heat treatment is conducted to activate the boron ion-injected into the polysilicon films 70 and 80.

Patterning is conducted on the mask material 90 by using the lithography and the RIE. Thereafter, etching is conducted on the polysilicon films 80 and 70 by using the mask material 90 as a mask to form a gate electrode 100.

Figures 8A, 8B, 8C:
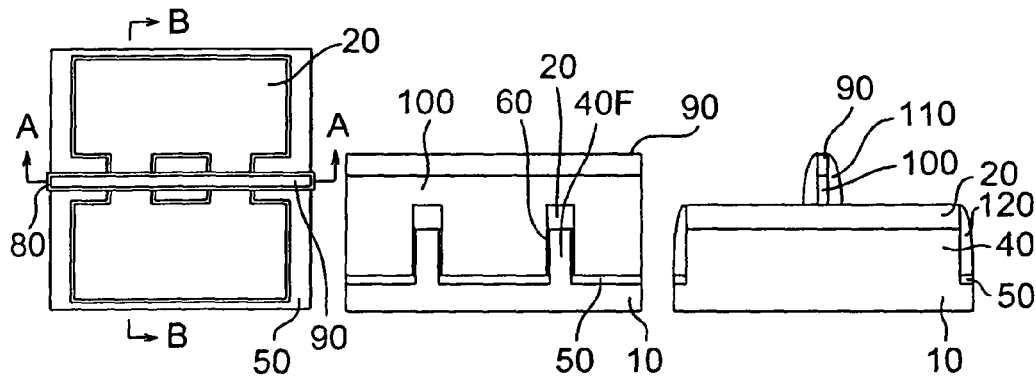
FIGS. 8A to 8C are a plan view and cross-sectional views showing a method for manufacturing fin FETs according to the first embodiment.

As shown in FIG. 8A to 8C, for example, a silicon oxide film having a thickness of approximately several nm is formed on the whole surface, and/or a silicon nitride film having a thickness of approximately 10 nm is deposited. Then, a side wall insulation film 110 is formed on each of side faces of the gate electrode 100 and the mask material 90 by using the RIE. At that time, a side wall insulation film 120 is formed on each of side faces of the semiconductor layer 40 and the mask material 20.

Figures 9A, 9B, 9C:
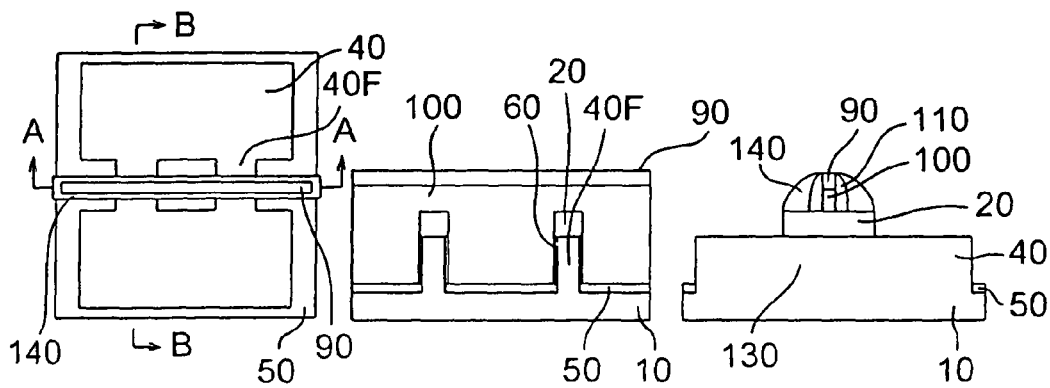
FIGS. 9A to 9C are a plan view and cross-sectional views showing a method for manufacturing fin FETs according to the first embodiment.

As shown in FIG. 9A to 9C, ion implantation of, for example, boron (B) into the semiconductor layer 40 is conducted from an oblique direction with a dose of approximately $1 \times 10^{15}$ cm$^{-2}$ by using the mask material 90 and the side wall insulation film 110 as a mask. As a result, a source/drain extension region 130 having a low concentration is formed.

In addition, an insulation film formed of a silicon nitride film having a thickness of approximately 50 nm is deposited. Thereafter, a side wall insulation film 140 is formed on the surface of the side wall insulation film 110 by using the RIE. At that time, parts of the mask material 20 and the side wall insulation film 120 formed on a region of the semiconductor layer 40 which will serve as a source/drain region later and exposed are removed.

Figures 10A, 10B, 10C:
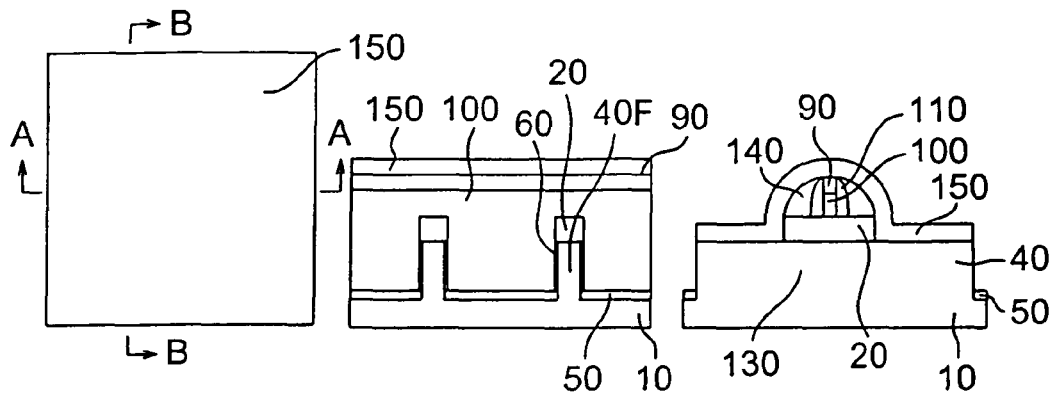
FIGS. 10A to 10C are a plan view and cross-sectional views showing a method for manufacturing fin FETs according to the first embodiment.
Figures 11A, 11B, 11C:
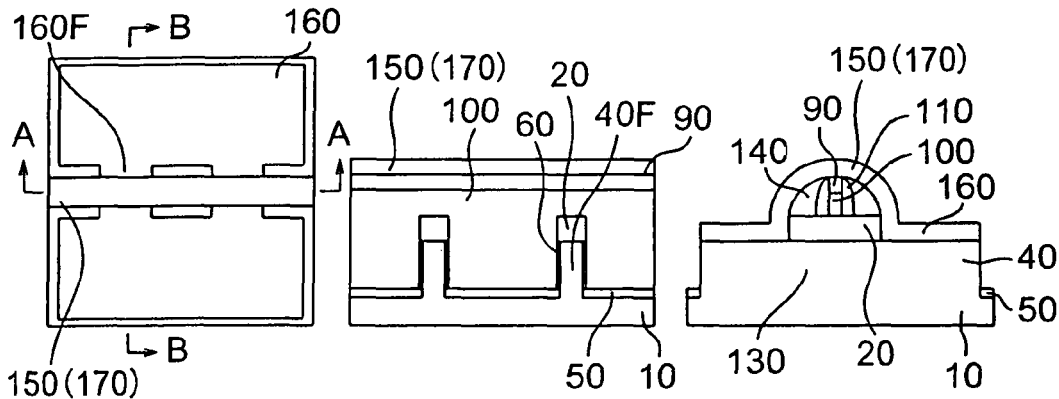
FIGS. 11A to 11C are a plan view and cross-sectional views showing a method for manufacturing fin FETs according to the first embodiment.
Figures 12A, 12B, 12C:
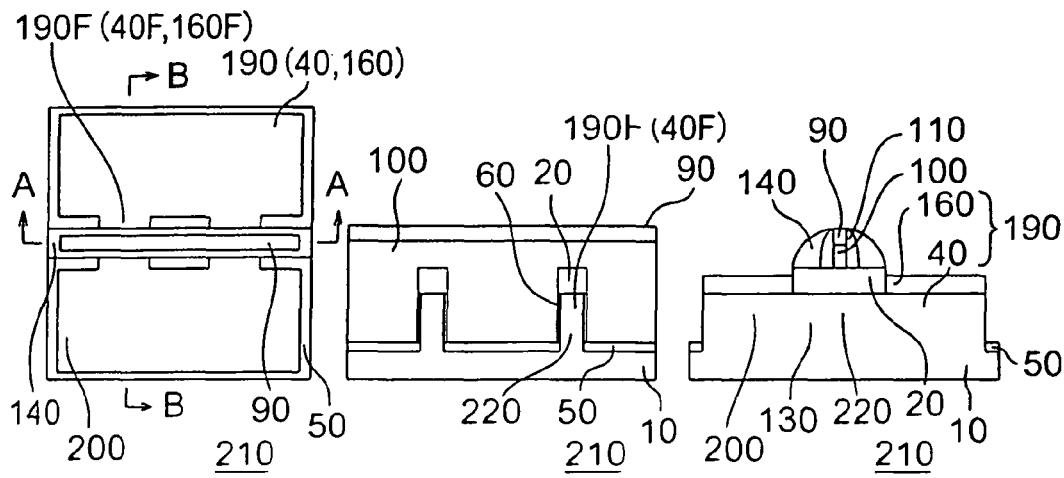
FIGS. 12A to 12C are a plan view and cross-sectional views showing a method for manufacturing fin FETs according to the first embodiment.
Figure 13:
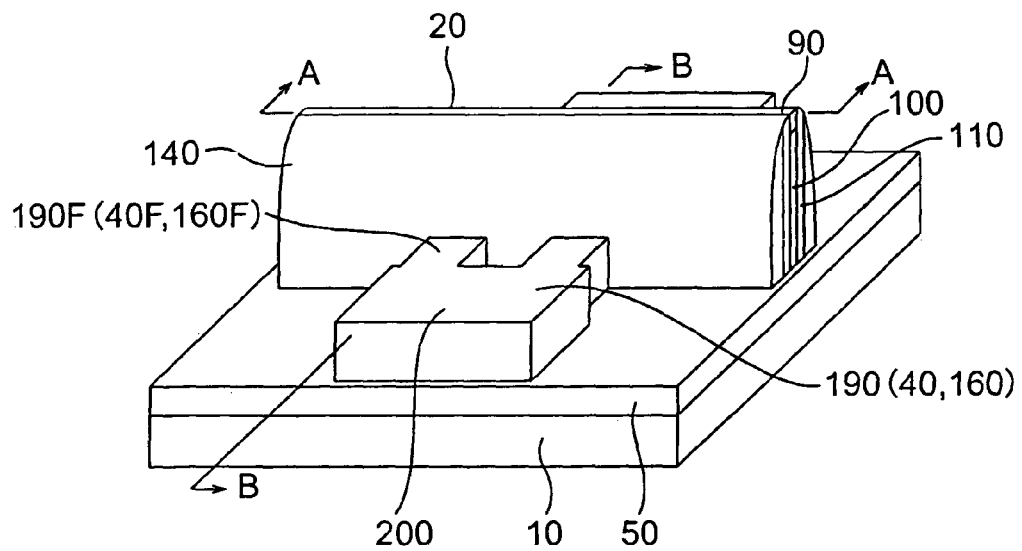
FIG. 13 is a perspective view showing a method for manufacturing fin FETs according to the first embodiment.

As shown in FIG. 10A to 10C, an amorphous silicon film 150 having a thickness of approximately 40 nm is deposited and formed over the whole surface with good coverage by using the CVD method. As shown in FIG. 11A to 11C, heat treatment is conducted at the temperature of, for example, 650° C. for approximately 10 minutes. As a result, an amorphous silicon film 150 formed on the top face and side faces of the semiconductor layer 40 is selectively formed into single crystals to form a single crystal silicon film 160, by using the solid phase epitaxy method.

At that time, the amorphous silicon film 150 formed in a region excepting the top face and the side faces of the semiconductor layer 40 is not formed into single crystals, but it remains the amorphous silicon film 150 or formed into polycrystals to form a polycrystal silicon film 170.

As shown in FIG. 12A to 12C and FIG. 13, only the amorphous silicon film 150 (or the polycrystal silicon film 170) is selectively removed by, for example, dry etching such as vapor etching using a gas containing halogen hydride at a temperature of approximately 550° C.

In this case, instead of the dry etching, wet etching using a mixed solution containing at least two of fluoric acid, nitric acid, acetic acid and water may be performed, or wet etching using a mixed solution containing at least TMA (trimethylamine) may be performed.

A raised semiconductor layer 190 having two fins 190F is formed by thus raising the exposed surface (the top face and side faces) of the semiconductor layer 40 having fins 40F as a whole toward the outside.

The raised semiconductor layer 190 is formed of the semiconductor layer 40 and the single crystal silicon film 160. The surface (top face and side faces) of the exposed part is formed so as to be located on the outer side than the surface (top face and side faces) of a part covered by the side wall insulation film 140.

By the way, as for the etching for selectively removing the amorphous silicon film 150 conducted by utilizing the difference between activation energy in the solid phase epitaxy and activation energy in the etching and performing the solid phase epitaxy at high temperatures of at least 600° C., the so-called skirting can be reduced while maintaining the throughput by conducting the etching at low temperatures of 600° C. or below.

The skirting means a phenomenon in which the surface of the raised semiconductor layer 190 formed near the top face of the insulation film 50 is formed so as to be gradually located on the outer side as it approaches an interface to the insulation film 50. If the temperature at which the etching is performed is lowered, the skirting can be suppressed more remarkably.

Thereafter, ion implantation is conducted to form a high concentration raised source/drain region 200. Thereafter, a fin FET 210 is manufactured by successively forming silicide, an interlayer insulation film and a contact plug which are not illustrated.

In the fin FET 210 manufactured by using the method described heretofore, the convex-shaped raised semiconductor layer having a plurality of fins 190F is formed in a surface part of the semiconductor substrate 10 as shown in FIG. 12A to 12C and FIG. 13, and the insulation film 50 is formed to an extent that a lower part of the raised semiconductor layer 190 is buried.

A channel region 220 is formed near a center part of the fin 190F included in the raised semiconductor layer 190. On both sides of the channel region 220 under the side wall insulation film 140, the source/drain extension region 130 is formed so as to have the channel region 220 between. In addition, in the raised semiconductor layer 190, the raised source/drain region 200 is formed adjacent to the source/drain extension region 130 so as to have the source/drain extension region 130 between.

As for the fin 190F, the gate insulation film 60 is formed on both side faces of the fin 190F near the channel region 220, and the mask material 20 is formed on the top face of the fin 190F near the channel region 220. On both side faces and the top face of each of the fins 190F, the gate electrode 100 is formed via the gate insulation film 60 and the mask material 20 so as to stride over the fin 190F. Furthermore, the mask material 90 is formed on the surface of the gate electrode 100, and the side wall insulation films 110 and 140 are formed on side faces of the gate electrode 100 and the mask material 90.

In the case of the present embodiment, the raised semiconductor layer 190 having the fins 190F is formed so as to have surfaces (top face and side faces) of a peripheral part except the central part located on the outer side than the surfaces (top face and side faces) of the central part covered by the gate electrode 100 and the side wall insulation films 110 and 140. In other words, a {110} side face of the fin-type semiconductor layer 190 in the source region and drain region 200 is advanced in a direction of a crystal orientation <110> than a {110} side face of the fin-type semiconductor layer 190 in the channel region 220 although the {110} side face of the fin-type semiconductor layer 190 in the source region and drain region 200 is parallel to the {110} side face of the fin-type semiconductor layer 190 in the channel region 220. In other words, although the {110} side face of the fin-type semiconductor layer 190F in the source region and drain region 200 is parallel to the {110} side face of the fin-type semiconductor layer 190 in the channel region 220, a width of the fin-type semiconductor layer in the source region and drain region 200 in the direction of the crystal orientation <110> is made to be wider than that in the channel region 220.

Furthermore, a {100} face (top face) of the fin-type semiconductor layer 190 in the source region and drain region 200 is raised in a direction of a crystal orientation <100> than a {100} top face of the fin-type semiconductor layer 190 in the channel region 220 although the {100} top face of the fin-type semiconductor layer 190 in the source region and drain region 200 is parallel to the {100} top face of the fin-type semiconductor layer 190 in the channel region 220. In other words, although the {100} top face of the fin-type semiconductor layer 190F in the source region and drain region 200 is parallel to the {100} top face of the fin-type semiconductor layer 190 in the channel region 220, a thickness of the fin-type semiconductor layer in the source region and drain region 200 in the direction of the crystal orientation <100> is thicker than that in the channel region 220.

By the way, if it is attempted to form the raised semiconductor layer 190 by using a semiconductor substrate 10 having a surface orientation of {100}, fins 190F having a side face crystal direction in the <110> direction are formed.

For example, the mobility of holes is the highest when the crystal direction of the surface on which the channel region is formed is the <110> direction. If a PMOSFET is formed by using the above-described fin FET 210, therefore, the mobility of the holes in the PMOSFET can be improved.

Figure 14:
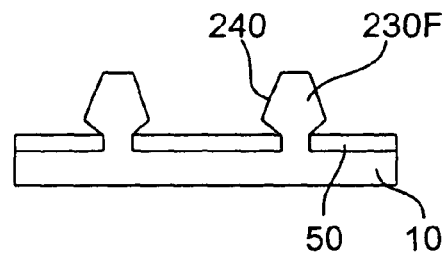
FIG. 14 shows a longitudinal section view of a comparative example.

As a comparative example, FIG. 14 shows a longitudinal section view of a part of a fin 230F included in the raised semiconductor layer 230 formed by using the vapor phase epitaxy method that is not covered by the gate electrode and the side wall insulation film.

If the raised semiconductor layer 230 is formed by using the vapor phase epitaxy method as in the comparative example, a facet 240 having a crystal direction in a <111> direction is generated on a side face of the fin 230F.

Thereafter, even if it is attempted to introduce impurities into the fin 230F from an oblique direction in order to form the raised source/drain region, it is not impossible to introduce a desired quantity of impurities to the vicinity of the lower part of the fin 230F because of the existence of the facet 240. This results in a problem that silicide cannot be formed near the lower part of the fin 230F and the parasitic resistance becomes large.

On the other hand, according to the present embodiment, it becomes possible to prevent a facet from being generated on the side face of the raised semiconductor layer 190 including the fins 190F. As a result, the parasitic resistance can be reduced and the transistor characteristics can be improved.

(2) Second Embodiment

Figures 16A, 16B, 16C:
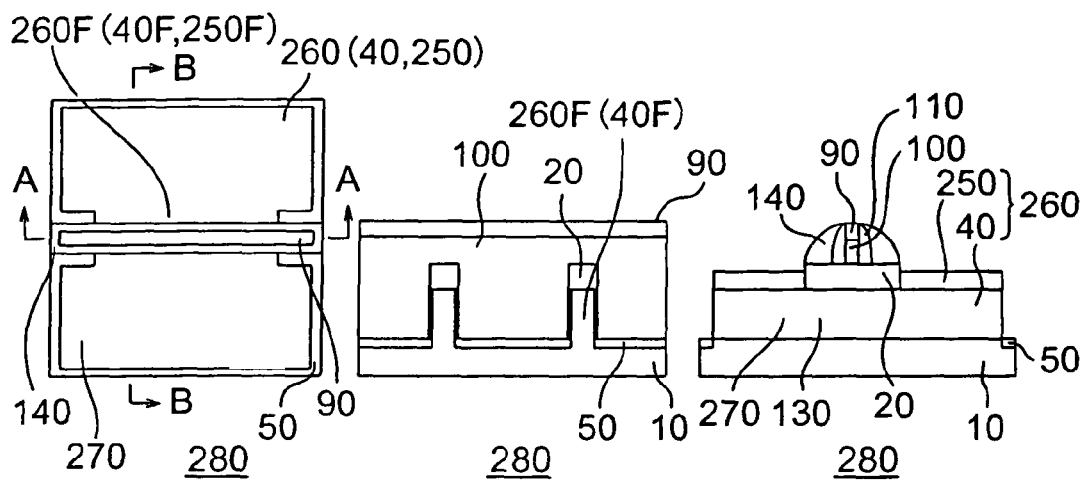
FIGS. 16A to 16C are a plan view and cross-sectional views showing a method for manufacturing fin FETs according to the second embodiment.
Figure 17:
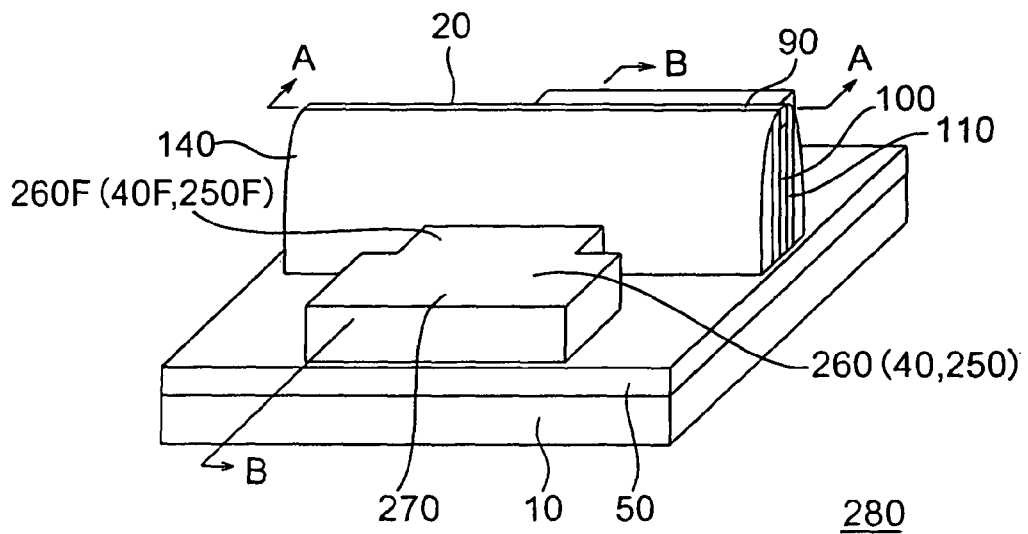
FIG. 17 is a perspective view showing a method for manufacturing fin FETs according to the second embodiment.

FIGS. 15 to 17 show a fin FET manufacturing method according to a second embodiment of the present invention.

Since processes shown in FIGS. 1 to 10 in the second embodiment are the same as those in the first embodiment, description of them will be omitted. The same components as those shown in FIG. 10 are denoted by like reference characters, and description of them will be omitted.

Figures 15A, 15B, 15C:
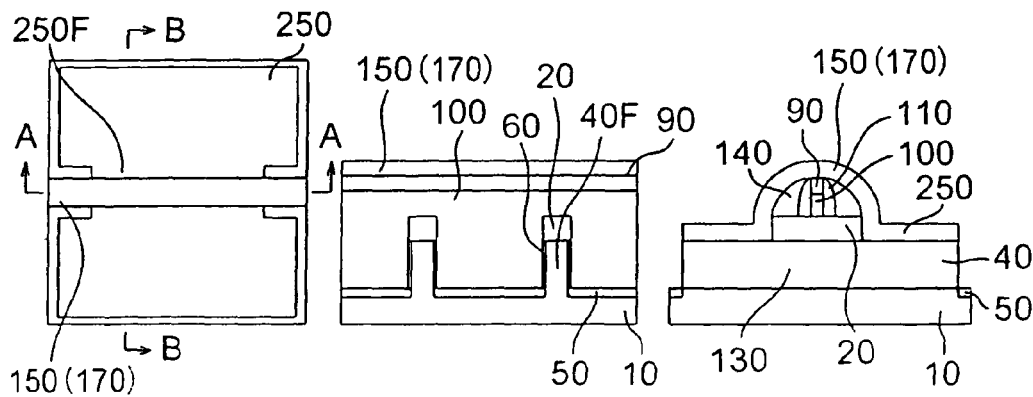
FIGS. 15A to 15C are a plan view and cross-sectional views showing a method for manufacturing fin FETs according to a second embodiment.

Heat treatment is conducted at a higher temperature and/or over a longer time as compared with the first embodiment. For example, heat treatment is conducted at the temperature of 700° C. over approximately 20 minutes. As a result, an amorphous silicon film 150 formed on the top face and side faces of a semiconductor layer 40 is selectively formed into single crystals to form a single crystal silicon film 250, by using the solid phase epitaxy method, as shown in FIG. 15A to 15C.

At that time, exposed parts of adjacent fins 40F are united into one body by conducting solid phase epitaxy until single crystal silicon films 250F formed in the same transistor and solid-grown from the adjacent fins 40F are connected.

By the way, in this case, the distance between the adjacent fins 40F formed in the same transistor is sufficiently shorter than the distance of the device isolation region (not illustrated). On the device isolation region, therefore, the amorphous silicon film 150 which is not formed into single crystals can be left. Therefore, single crystal silicon films 250F solid-grown from fins 40F of different transistors are not connected.

Thereafter, processes similar to those in the first embodiment are executed. As a result, only the amorphous silicon film 150 (or the polycrystal silicon film 170) is selectively removed by using dry etching or wet etching as shown in FIG. 16A to 16C and FIG. 17.

Thereafter, ion implantation is conducted to form a high concentration raised source/drain region 270. In addition, silicide, an interlayer insulation film and a contact plug which are not illustrated are formed successively to manufacture a fin FET 280.

In the fin FET 280 manufactured by using the method heretofore described, a raised semiconductor layer 260 having fins 260F is formed so as to have surfaces (top face and side faces) of a peripheral part except the central part located on the outer side than the surfaces (top face and side faces) of the central part covered by the gate electrode 100 and the side wall insulation films 110 and 140, as shown in FIG. 16A to 16C and FIG. 17.

According to the present embodiment, it thus becomes possible to prevent a facet from being generated on the side face of the raised semiconductor layer 260 including the fins 260F, in the same way as the first embodiment. As a result, the parasitic resistance can be reduced and the transistor characteristics can be improved.

In addition, in the case of the present embodiment, parts of adjacent fins 260F which are not covered by the gate electrode 100 and the side wall insulation films 110 and 140 are formed so as to be electrically connected to each other.

According to the present embodiment, the area of the top face of the fin 260F can thus be made large as compared with the fin 190F in the first embodiment. If it is attempted to make contact with the top face and side faces of the raised source/drain region 270, therefore, the contact area can be increased as compared with the case where contact with only the side face of the fin 190F. As a result, the parasitic resistance can be further reduced and the transistor characteristics can be further improved.

By the way, the embodiments described above are nothing but examples, but the embodiments do not restrict the present invention. For example, the number of fins 190F and 260F respectively included in the semiconductor layers 190 and 260 need not be two, but only one fin may be formed, or a plurality of fins such as three fins may be formed.

What is claimed is:

1. A semiconductor device manufacturing method comprising:
   depositing a mask material on a semiconductor substrate, performing patterning on surface parts of the mask material and the semiconductor substrate, and thereby forming a semiconductor layer having a convex shape;
   forming an insulation film having a film thickness to an extent that a lower part of the semiconductor layer is buried;
   forming a gate insulation film on one set of both opposed side faces of the semiconductor layer;
   depositing a gate electrode material on the insulation film, the gate insulation film and the mask material, performing patterning on the gate electrode material and the gate insulation film, and thereby forming a gate electrode on the one set of both opposed side faces and a top face of the semiconductor layer via the gate insulation film and the mask material;
   forming a side wall insulation film on side faces of the gate electrode, and removing the mask material which is not covered by the gate electrode and the side wall insulation film;
   forming an amorphous semiconductor film on the semiconductor layer, the insulation film, the gate electrode and the side wall insulation film;

selectively forming the amorphous semiconductor film formed on the top face and side faces into single crystals and thereby forming a raised semiconductor layer;

selectively removing a region which is not formed into single crystals in the amorphous semiconductor film; and performing ion implantation of predetermined impurities into the picked-up semiconductor layer by using the gate electrode and the side wall insulation film as a mask, and thereby forming a source region and a drain region on a side face on which the gate electrode is not formed.

2. The semiconductor device manufacturing method according to claim 1, wherein, when the raised semiconductor layer is formed, the amorphous semiconductor film on the top face and side faces is selectively formed into single crystals so as to connect adjacent semiconductor layers and thereby forming a raised semiconductor layer.

3. The semiconductor device manufacturing method according to claim 1, wherein, when a region which is not formed into single crystals is selectively removed, the region which is not formed into single crystals is selectively removed by using vapor etching using a gas containing halogen hydride.

4. A semiconductor device manufacturing method comprising:

forming a fin-type semiconductor layer having a {110} crystal plane as a side face thereof on a semiconductor substrate by etching the semiconductor substrate;

forming a gate insulation film on a channel forming region of the fin-type semiconductor layer;

forming a gate electrode on the gate insulation film;

depositing an amorphous semiconductor film on a top face and the side face in a source forming region and a drain forming region of the fin-type semiconductor layer;

forming the amorphous semiconductor film into single crystals by using a solid phase epitaxy method to advance the side face of the fin-type semiconductor layer in the source forming region and the drain forming region in a direction of a crystal orientation <110> as compared with the side face of the fin-type semiconductor layer in the channel forming region; and introducing impurities into the source forming region and the drain forming region of the fin-type semiconductor layer to form a source region and a drain region.

5. The semiconductor device manufacturing method according to claim 4, wherein the top face of the fin-type semiconductor layer is a {100} crystal plane, and when forming the amorphous semiconductor film into single crystals, the top face of the fin-type semiconductor layer in the source region and the drain region is raised upward as compared with the top face of the fin-type semiconductor layer in the channel region.

* * * * *